United States Patent [19]

Ota

[11] Patent Number: 5,060,189
[45] Date of Patent: Oct. 22, 1991

[54] SEMICONDUCTOR DEVICE WITH REDUCED CROSSTALK BETWEEN LINES

[75] Inventor: Yoshiji Ota, Nara, Japan

[73] Assignee: Sharp Kabushiki Kaisha, Osaka, Japan

[21] Appl. No.: 627,617

[22] Filed: Dec. 12, 1990

Related U.S. Application Data

[63] Continuation of Ser. No. 306,244, Feb. 2, 1989, abandoned, which is a continuation of Ser. No. 49,740, May 13, 1987, abandoned.

[30] Foreign Application Priority Data

Jun. 13, 1986 [JP] Japan ............................ 61-90698[U]

[51] Int. Cl.$^5$ ........................ G11C 7/02; G11C 5/06
[52] U.S. Cl. ...................................... 365/69; 365/51; 365/63
[58] Field of Search ................ 365/51, 63, 64, 207, 365/208

[56] References Cited

U.S. PATENT DOCUMENTS 3,237,172  2/1966  Gosslau et al. ................ 365/69
4,675,845  6/1987  Itoh et al. ..................... 365/51

FOREIGN PATENT DOCUMENTS 167281  1/1986  European Pat. Off. .......... 365/63
254489  12/1985  Japan ............................ 365/63

Primary Examiner—Stuart N. Hecker
Assistant Examiner—Jack A. Lane
Attorney, Agent, or Firm—Irell & Manella

[57] ABSTRACT

A semiconductor device such as a memory device has many sets of complementary data lines disposed parallel to one another. Mutually complementary lines are crossed with respect to each other nearly at the center such that their inter-line capacitances with a neighboring line are nearly equal. Crosstalks between either of the complementary word lines and such a neighboring line can be thereby reduced.

4 Claims, 2 Drawing Sheets

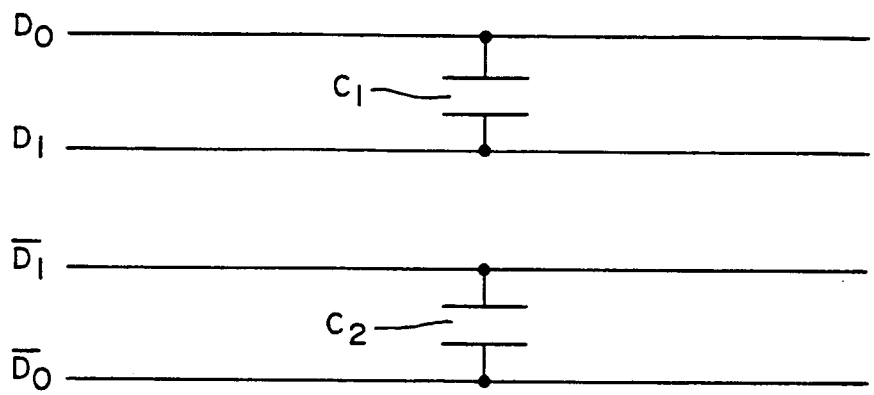
(PRIOR ART)
FIG.—1
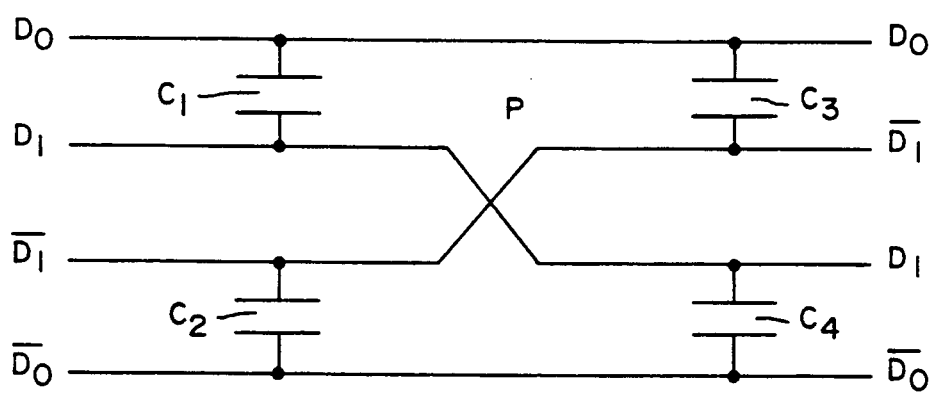
FIG.—2

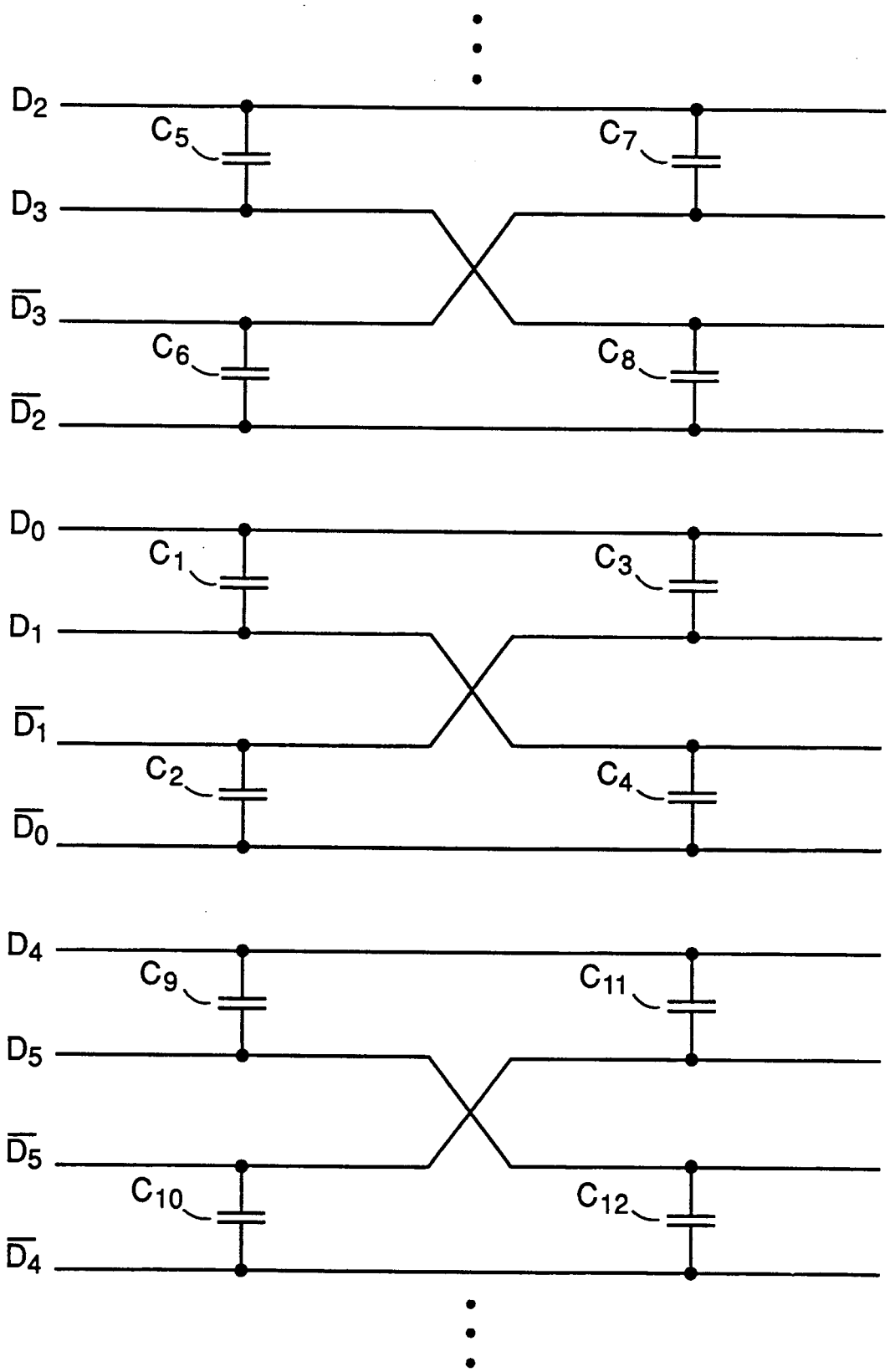
FIG._3

SEMICONDUCTOR DEVICE WITH REDUCED CROSSTALK BETWEEN LINES

This is a continuation of application Ser. No. 07/306,244 filed Feb. 2, 1989, now abandoned, which is a continuation of application Ser. No. 07/049,740 filed May 13, 1987 and now abandoned.

BACKGROUND OF THE INVENTION

This invention relates to a semiconductor device and more particularly to a semiconductor IC device with reduced crosstalks between adjacent lines.

With the recent development in the manufacturing technologies of semiconductor devices, various components of integrated circuits are becoming miniaturized. As substrates become more densely populated with components, the distance between adjacent signal lines on the substrate is becoming smaller than ever. In a circuit with lines separated only by a small distance, the inter-line coupling capacitance becomes significantly large with respect to the ground capacitance of each line with respect to the substrate. Crosstalks between neighboring lines can cause variations in signal voltages, adversely affecting the safety margin of operation and causing errors in the operation. In circuits like semiconductor memory devices which are required to read and write extremely weak signals, in particular, the problem of crosstalks can seriously affect the reliability of the device.

SUMMARY OF THE INVENTION

It is therefore an object of the present invention to provide a semiconductor device which eliminates the aforementioned disadvantages by reducing the crosstalks between the lines of highly integrated semiconductor circuits.

The above and other objects of the present invention are achieved by providing a semiconductor IC device with a plurality of pairs of signal lines next to one another such that the lines having opposite phases during an active period are crossed in the middle. With the lines thus crossed, coupling capacitances may occur between lines but if the lines are considered as a whole, the two ends are at opposite phases because the lines are crossed in the middle. In other words, the effects of inter-line coupling capacitances are essentially offset and crosstalks can be eliminated from the circuit operations.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 1 is a wiring diagram showing the conventional arrangement of data input-output lines in a semiconductor device, and FIG. 2 is a wiring diagram of a portion of data input-output lines of a semiconductor device embodying the present invention.

FIG. 3 is a wiring diagram of which FIG. 2 is a part.

DETAILED DESCRIPTION OF THE INVENTION

Data input-output lines of a semiconductor memory device may be considered as an example which can be most easily affected by crosstalks between signal lines. With reference first to FIG. 1, lines $D_0$ and $\overline{D}_0$ and lines $D_1$ and $\overline{D}_1$ are mutually complementary data input-output lines of a semiconductor device of a conventional type. During an inactive period, they are all precharged to the level of $V_{CC}/2$. Let us now suppose that the data lines $D_1$ and $\overline{D}_1$ are selected in a write cycle and further that the line $D_1$ is controlled to the logical "1" (such as $V_{CC}$) while the line $\overline{D}_1$ is to the logical "0" (such as the ground potential). In this situation, the potentials of the lines $D_0$ and $\overline{D}_0$ are affected through the coupling capacitances $C_1$ and $C_2$ respectively between the lines $D_0$ and $D_1$ and between the lines $\overline{D}_1$ and $\overline{D}_0$ as shown in FIG. 1. Regarding the lines $D_0$ and $\overline{D}_0$ which were not selected, on the other hand, the very weak voltage obtained from a memory cell through bit lines must be differentially amplified. As stated above, however, the potentials of the lines $D_0$ and $\overline{D}_0$ are influenced by the lines $D_1$ and $\overline{D}_1$. If this influence becomes of the order of magnitude of the weak voltage received through the bit lines, differential amplification may fail and incorrect data may be rewritten in memory cells.

According to the present invention, the lines $D_1$ and $\overline{D}_1$ are crossed with each other as shown in FIGS. 2 and 3 nearly at the center P of their lengths such that their adjacent relationships with the neighboring lines $D_0$ and $\overline{D}_0$ are interchanged and that the coupling capacitance $C_1$ between the lines $D_0$ and $D_1$, the capacitance $C_2$ between the lines $\overline{D}_0$ and $\overline{D}_1$, the capacitance $C_3$ between the lines $D_0$ and $\overline{D}_1$ and the capacitance $C_4$ between the lines $\overline{D}_0$ and $D_1$ as shown in FIG. 2 are nearly equal. In other words, the lines $D_0$ and $D_1$ are next to each other on the left-hand side of the center position P but the line $D_0$ is close to the line $\overline{D}_1$, for example, such that the capacitances $C_1$ and $C_3$ are nearly equal to each other. FIG. 3 shows how data input-output lines having a plurality of sets of complementary lines, each of the sets being structured as shown in FIG. 2, may be arranged.

Let us assume again that the lines $D_1$ and $\overline{D}_1$ are selected in a write cycle and further that the line $D_1$ is controlled to the logical "1" (such as $V_{CC}$) while the line $\overline{D}_1$ is to the logical "0" (such as the ground potential). As explained for the case of FIG. 1, the lines $D_0$ and $\overline{D}_0$ are again affected by these controls of the lines $D_1$ and $\overline{D}_1$ when a differential application becomes necessary for a weak voltage obtained from a memory cell through bit lines. With the lines crossed as shown in FIG. 2, however, the overall potentials of the lines $D_0$ and $\overline{D}_0$ are substantially unaffected from the neighboring lines $D_1$ and $\overline{D}_1$ because the effects of the coupling capacitances $C_1$ (or $C_2$) and $C_3$ (or $C_4$) are opposite in phase and nearly of the same magnitude. In other words, there is no error to be caused when data are rewritten through the lines $D_0$ and $\overline{D}_0$. In summary, the present invention teaches a simple structural change by which crosstalks among the lines in an IC can be reduced. More highly integrated circuits can thus be realized and semiconductor devices with increased densities can be obtained without adversely affecting their reliability.

What is claimed is:

1. A semiconductor integrated circuit device having substantially parallel data input-output lines, said data input-output lines comprising
    a first line,
    a second line which is complementary to said first line, a third line disposed between said first and second lines so as to be in part directly adjacent to said first line and in part directly adjacent to said second line, and a fourth line which is complementary to said third line and is disposed between said first and second lines so as to be in part directly adjacent to said first line and in part directly adjacent to said second line, said third and fourth lines being connected to means for applying mutually opposite signals to said third and fourth lines during an active period whereby crosstalks between said first and third lines are cancelled by the presence of said fourth line.

2. The semiconductor device of claim 1 wherein said third and fourth lines cross each other nearly at the center of their lengths such that the inter-line capacitance between said first and third lines is nearly equal to the inter-line capacitance between said first and fourth lines.

3. A semiconductor integrated circuit device having substantially parallel data input-output lines, said data input-output lines comprising a plurality of groups of lines, each of said groups of lines including a first line, a second line which is complementary to said first line, a third line disposed between said first and second lines so as to be in part directly adjacent to said first line and in part directly adjacent to said second line, and a fourth line which is complementary to said third line and is disposed between said first and second lines so as to be in part directly adjacent to said first line and in part directly adjacent to said second line, said third and fourth lines being connected to means for applying mutually opposite signals to said third and fourth lines during an active period whereby crosstalks between said first and third lines are cancelled by the presence of said fourth line.

4. The semiconductor integrated circuit device of claim 3 wherein said third and fourth lines in each of said groups of lines cross each other nearly at the center of their lengths such that the inter-line capacitance between said first and third lines is nearly equal to the inter-line capacitance between said first and fourth lines.

* * * * *